(12) United States Patent
Deng et al.

(10) Patent No.: US 12,224,036 B2
(45) Date of Patent: Feb. 11, 2025

(54) HIGH SPEED MEMORY DEVICE WITH DATA MASKING

(71) Applicant: Yangtze Memory Technologies Co., Ltd., Hubei (CN)

(72) Inventors: Chunfei Deng, Wuhan (CN); Shiyang Yang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 148 days.

(21) Appl. No.: 17/447,827

(22) Filed: Sep. 16, 2021

(65) Prior Publication Data
US 2022/0392537 A1    Dec. 8, 2022

Related U.S. Application Data

(63) Continuation of application No. PCT/CN2021/098058, filed on Jun. 3, 2021.

(51) Int. Cl.
| | | |
|---|---|---|
| *G11C 16/04* | (2006.01) | |
| *G11C 7/10* | (2006.01) | |
| *G11C 11/4096* | (2006.01) | |
| *H03M 9/00* | (2006.01) | |

(52) U.S. Cl.
CPC ........ *G11C 7/1009* (2013.01); *G11C 11/4096* (2013.01); *H03M 9/00* (2013.01)

(58) Field of Classification Search
CPC ..... G11C 16/10; G11C 16/0483; G11C 16/32; G11C 7/1006; G11C 7/1087; G11C 7/1012; G11C 7/1093; G11C 7/222; H03M 9/00
USPC .................................................. 365/185.17
See application file for complete search history.

(56) References Cited

U.S. PATENT DOCUMENTS

| | | |
|---|---|---|
| 6,252,804 B1 | 6/2001 | Tomita |
| 7,657,800 B2 | 2/2010 | Lim et al. |
| 8,015,459 B2 | 9/2011 | Lim et al. |

(Continued)

FOREIGN PATENT DOCUMENTS

| | | |
|---|---|---|
| CN | 102545876 A | 7/2012 |
| JP | 2006-65418 A | 3/2006 |

OTHER PUBLICATIONS

Combined Chinese Office Action and Search Report issued on Jun. 2, 2022 in Chinese Patent Application No. 202180001821.5, 17 pages (with English Translation of Category of Cited Documents).

(Continued)

*Primary Examiner* — Tha-Oh H Bui
(74) *Attorney, Agent, or Firm* — Oblon, McClelland, Maier & Neustadt, L.L.P.

(57) ABSTRACT

Aspects of the disclosure provide a semiconductor device. For example, the semiconductor device can include a first deserializer, a second deserializer, and a write data converter coupled to the first deserializer and the second deserializer. The first deserializer can be configured to convert serial data to parallel data based on a set of write clock signals, thus the parallel data has a first timing alignment with regard to the set of write clock signals. The second deserializer can be configured to generate a mask pattern based on the set of write clock signals, thus the mask pattern has a second timing alignment with regard to the set of write clock signals. The write data converter can be configured to generate valid data based on the parallel data and the mask pattern.

20 Claims, 8 Drawing Sheets

(56) References Cited

U.S. PATENT DOCUMENTS

| | | | |
|---|---|---|---|
| 8,432,768 B2* | 4/2013 | Ware | G11C 7/222 |
| | | | 365/189.011 |
| 9,564,206 B2* | 2/2017 | Shido | G11C 11/4076 |
| 9,711,192 B2* | 7/2017 | Kim | G11C 5/147 |
| 9,983,925 B2* | 5/2018 | Dono | G06F 11/1004 |
| 10,338,997 B2 | 7/2019 | Dono et al. | |
| 2004/0128578 A1 | 7/2004 | Jonnalagadda | |
| 2008/0052567 A1 | 2/2008 | Lim et al. | |
| 2010/0106900 A1 | 4/2010 | Lim et al. | |
| 2013/0155792 A1 | 6/2013 | Matsui | |
| 2016/0034340 A1 | 2/2016 | Dono et al. | |
| 2018/0293128 A1 | 10/2018 | Dono et al. | |

OTHER PUBLICATIONS

Combined Chinese Office Action and Search Report issued on Aug. 17, 2022 in Chinese Application No. 202180001821.5 (with Translation of Category of Cited Documents), 19 pages.

International Search Report issued Feb. 25, 2022 in PCT/CN2021/098058, 5 pages.

* cited by examiner

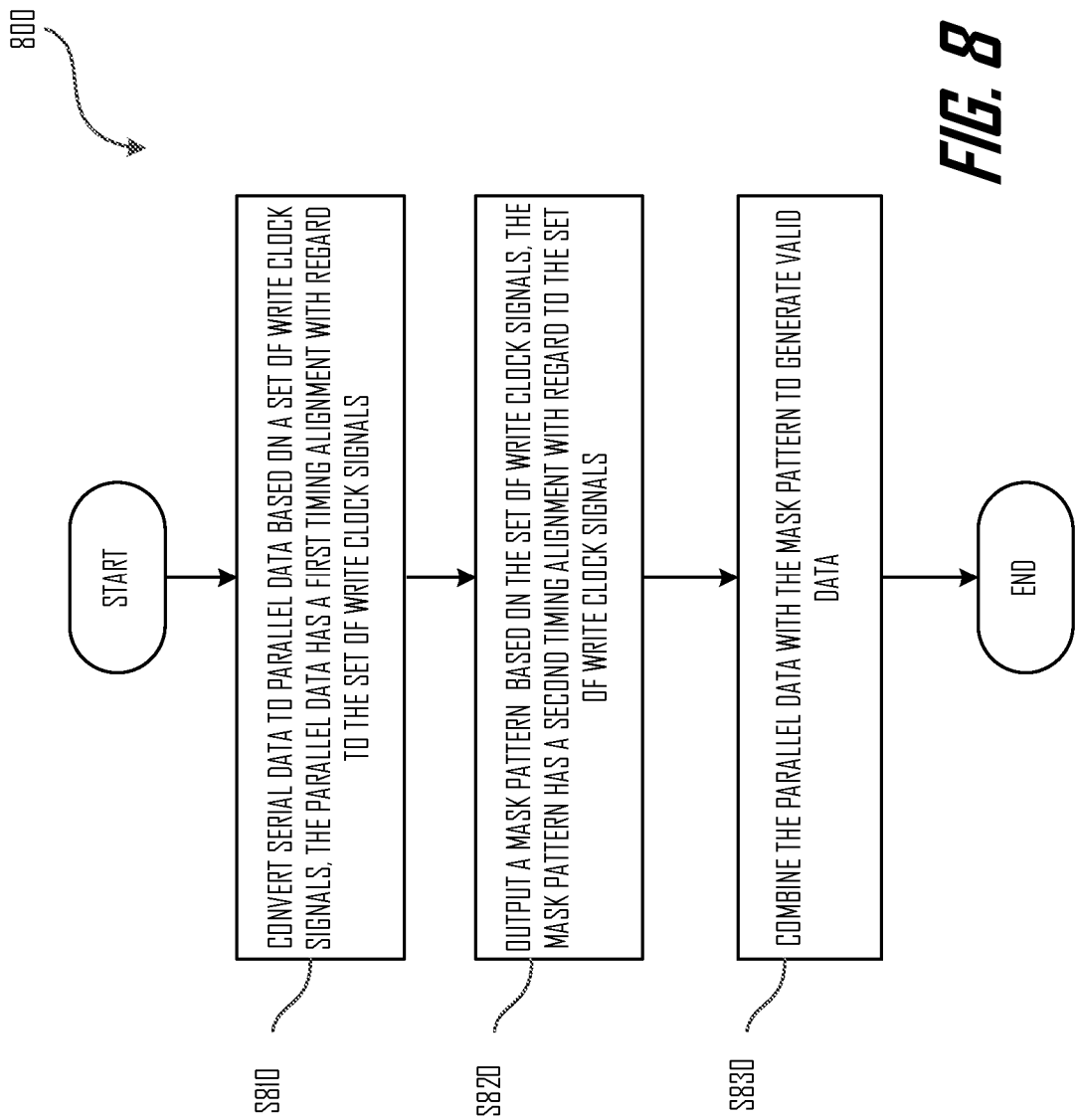

HIGH SPEED MEMORY DEVICE WITH DATA MASKING

RELATED APPLICATION

The present application is a bypass continuation of International Application No. PCT/CN2021/098058, filed on Jun. 3, 2021. The entire disclosure of the prior application is hereby incorporated by reference in its entirety.

TECHNICAL FIELD

The present application describes embodiments generally related to semiconductor memory devices.

BACKGROUND

As semiconductor devices, such as semiconductor memory devices, become more capable, one consistent trend is to increase the amount of data to be transferred per time period. For example, modern semiconductor memory devices can require data to be written thereto and read therefrom at high speed.

A data masking operation can be used to mask a portion of a data stream that is not necessary to be written to a semiconductor memory device during a write operation. It is desired that the data masking operation does not compromise the speed at which the semiconductor memory device operates.

SUMMARY

Aspects of the disclosure provide a semiconductor device. For example, the semiconductor device can include a first deserializer, a second deserializer, and a write data converter coupled to the first deserializer and the second deserializer. The first deserializer can be configured to convert serial data to parallel data based on a set of write clock signals, thus the parallel data has a first timing alignment with regard to the set of write clock signals. The second deserializer can be configured to generate a mask pattern based on the set of write clock signals, thus the mask pattern has a second timing alignment with regard to the set of write clock signals. The write data converter can be configured to generate valid data based on the parallel data and the mask pattern.

In an embodiment, the first timing alignment and the second timing alignment can allow the mask pattern being time-aligned with the parallel data. In some examples, the first deserializer and the second deserializer can be configured to have a same circuit structure. The same circuit structure can include a sampling stage, a first shift stage, a second shift stage and an output stage. The sampling stage can be configured to sample a data input carrying the serial data based on a data strobe signal. The first shift stage includes a cascaded shift register path that shifts the sampled serial data based on a first write clock signal and generates intermediate parallel data. The second shift stage includes parallel cascaded shift register paths to shift the intermediate parallel data based on a second write clock signal and generate parallel data. The output stage can be configured to output the parallel data based on a third write clock signal.

In an embodiment, the second deserializer can be configured to have a matching timing characteristic to the first deserializer. For example, the second deserializer can be configured to have matching transistor delays to the first deserializer. As another example, the second deserializer can be configured to have matching wire delays to the first deserializer.

In an embodiment, the semiconductor device can further include a clock generator coupled to the first deserializer and the second deserializer. The clock generator can be configured to generate the set of write clock signals based on a data strobe signal. For example, the clock generator can be configured to output the set of write clock signals with a timing pattern based on based on an address signal, such as one or more bits of the address signal, three least significant bits of the address signal and the like. As another example, the clock generator can includes a clock divider and a timing control circuitry coupled to the clock divider. The clock divider can be configured to generate a plurality of divided clock signals with frequencies divided from the data strobe signal. The timing control circuitry can be configured to output, based on the divided clock signals, the set of write clock signals with the timing pattern. The timing pattern can be used to control a loading time of the parallel data.

Aspects of the disclosure also provide a method for masking data. The method can include converting serial data using a first deserializer to output parallel data based on a set of write clock signals, and thus the parallel data has a first timing alignment with regard to the set of write clock signals. The method can also include outputting a mask pattern using a second deserializer based on the set of write clock signals, and thus the mask pattern has a second timing alignment with regard to the set of write clock signals. The method can further include combining the parallel data with the mask pattern to generate valid data.

In an embodiment, the method can further include time-aligning the mask pattern with the parallel data based on the first timing alignment and the second timing alignment. In another embodiment, the method can further include forming the first deserializer and the second deserializer of a same circuit structure. In yet another embodiment, the method can further include forming the second deserializer with matching timing characteristic to the first deserializer. For example, the method can further include forming the second deserializer with matching transistor delays to the first deserializer. As another embodiment, the method can further include forming the second deserializer with matching wire delays to the first deserializer.

In an embodiment, the method can further include generating the set of write clock signals based on a data strobe signal. For example, the method can further include outputting the set of write clock signals with a timing pattern based on three least significant bits of an address signal. As another example, the method can further include frequency-dividing a data strobe signal to generate a plurality of divided clock signals, and outputting, based on the divided clock signals, the set of write clock signals with the timing pattern. The timing pattern can be used to control a loading time of the parallel data.

Aspects of the disclosure further provide a memory device. The memory device can include a memory cell array and peripheral circuitry. The memory cell array can be configured to write data in parallel. The peripheral circuitry can include a first deserializer, a second deserializer, and a write data converter coupled to the first deserializer and the second deserializer. The first deserializer can be configured to convert serial data to parallel data based on a set of write clock signals, thus the parallel data has a first timing alignment with regard to the set of write clock signals. The second deserializer can be configured to generate a mask pattern based on the set of write clock signals, thus the mask pattern has a second timing alignment with regard to the set of write clock signals. The write data converter can be configured to generate valid data for writing to the memory cell array by combining the parallel data with the mask pattern.

In an embodiment, the memory device can include a three-dimensional NAND Flash memory device

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a flow chart illustrating a process for masking data according to some embodiments of the disclosure.

DETAILED DESCRIPTION

Figure 1:
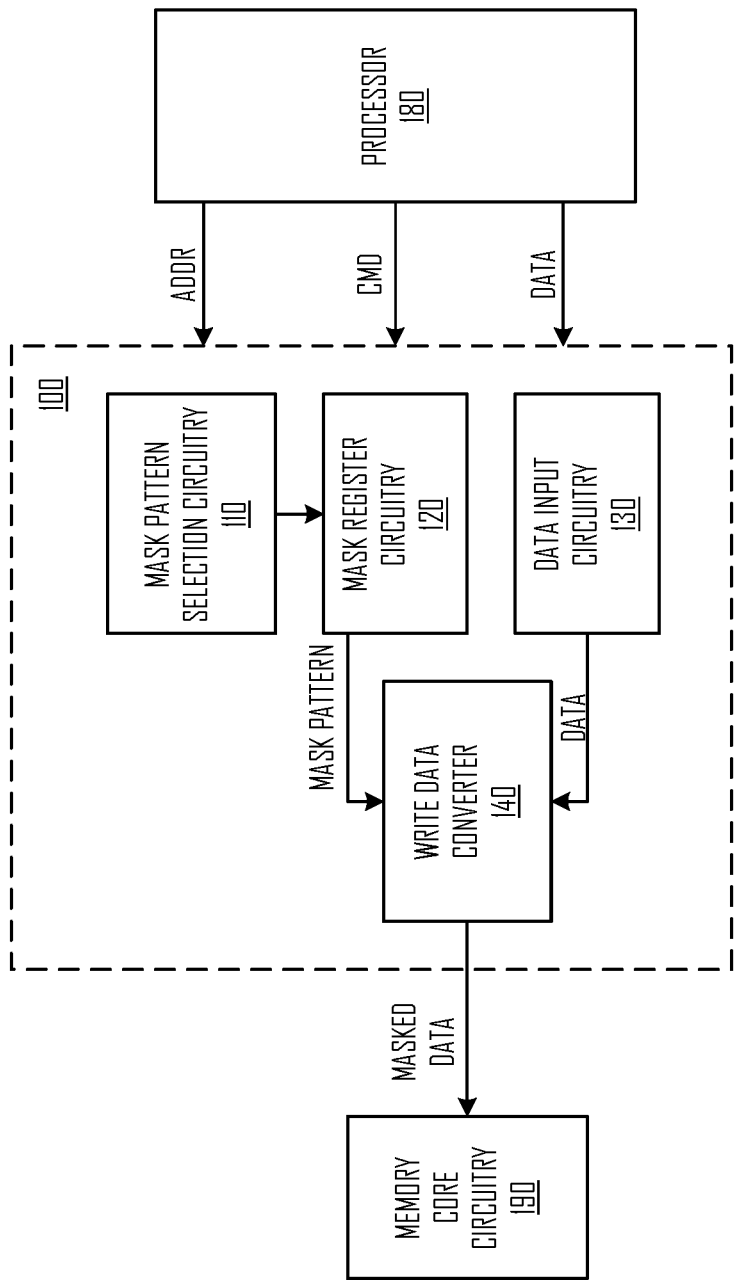
FIG. 1 is a functional block diagram of a data masking circuitry in a related example.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide techniques to time-align a mask pattern with data for high speed memory devices. Generally, serial data is converted to parallel data by a deserializer (also referred to as a first deserializer) before writing to memory cells. According to some aspects of the disclosure, the mask pattern can be provided using another deserializer (also referred to as a second deserializer) with a matching timing characteristic to the first deserializer. Thus, the mask pattern and the parallel data can be time-aligned, and valid data for writing can be generated by combining the parallel data with the mask pattern.

Modern electronic devices and systems include high-speed semiconductor memory devices for various data storage purpose. In some examples, random access memory (RAM) is a type of semiconductor memory that can be read and changed in any order, and is typically used to store working data and machine code to be accessible to a processor. While technologies improve the operation speed of the processor, the operation speed of RAM may need to be increased to avoid being a bottle neck for a high speed system.

Dynamic random access memory (DRAM) is a type of RAM. In order to operate in a high speed system, synchronous DRAMs, known as SDRAMs, have been developed. An SDRAM includes an interface that is coordinated by an externally supplied system clock. The system clock is in synchronization with the processing speed of the overall system, and thus read and write operations performed on the SDRAM can be in synchronization with the system clock. SDRAMs can be categorized into single data rate (SDR) SDRAMs and double data rate (DDR) SDRAMs. In an SDR SDRAM, data can be read and written at rising edges or falling edges (not both) of the system clock for example. In a DDR SDRAM, data can be read and written at both of rising edges and falling edges of the system clock for example. Therefore, a DDR SDRAM can have a data bandwidth which is twice the frequency of the system clock for example.

In some instances, it is desired to write only a portion of a data stream to a memory device, keeping some of the data stored in the memory device unchanged. A write mask can be used to mask the data stream during the write operation and block some of the data stream from reaching the individual memory cells that should remain unchanged. In a related example, a DRAM can include a data mask pin associated with every eight data pins, and the data mask pin can be used to indicate whether eight bits of data on the eight data pins should be written to memory cells or not. For example, a mask signal at a data mask pin can force eight bits of data on the eight data pins associated with the data mask pin to change from a programmed state to an erased state. The input data having the erased state will not be written to the memory cells. It is noted that the data mask pins increase the total pin count of the DRAM.

FIG. 1 shows a functional block diagram of a data masking circuitry 100 in another related example. The data masking circuitry 100 is coupled with a memory core circuitry 190 and can mask a portion of data to be written to the memory core circuitry 190 during a write operation. In an example, the data masking circuitry 100 includes a mask register circuitry 120 that stores mask patterns that may be used for data masking. The data masking circuitry 100 also includes a mask pattern selection circuitry 110 that provides a selection signal to the mask register circuitry 120 to select one of the mask patterns. The data masking circuitry 100 can receive a variety of control signals from a processor 180, such as a command signal CMD, an address signal ADDR and a data signal DATA. In an example, in response to the address signal ADDR, the mask pattern selection circuitry 110 can decode a portion of the address signal ADDR, such as the least significant two bits of the address signal ADDR, and provide the selection signal to the mask register circuitry 120 based on the decoded address signal ADDR. In response to the selection signal, the mask register circuitry 120 can output one of mask patterns stored therein. The output mask pattern can be combined with data output from a data input circuitry 130 (in response to the data signal DATA) by a write data converter 140 and the write data converter 140 can output the masked data, and the masked data can be written to the memory core circuitry 190.

According to an aspect of the disclosure, due to manufacturing variations and tight design margins, timing alignment of the mask pattern and data at inputs of the write data converter 140 can be difficult to achieve. The timing misalignment between the mask pattern and the data at the inputs of the write data converter 140 can reduce an effective write cycle of the memory core circuitry 190, which is equal to a nominal write cycle subtracting the timing misalignment, thus the timing misalignment can limit an overall operation speed.

According to some aspects of the disclosure, equivalent circuit structure can be used respectively on the processing paths for data and mask pattern. Further, the processing paths for the data and the mask pattern can be configured to have matching timing characteristics to time-align the data and the mask pattern.

Figure 2:
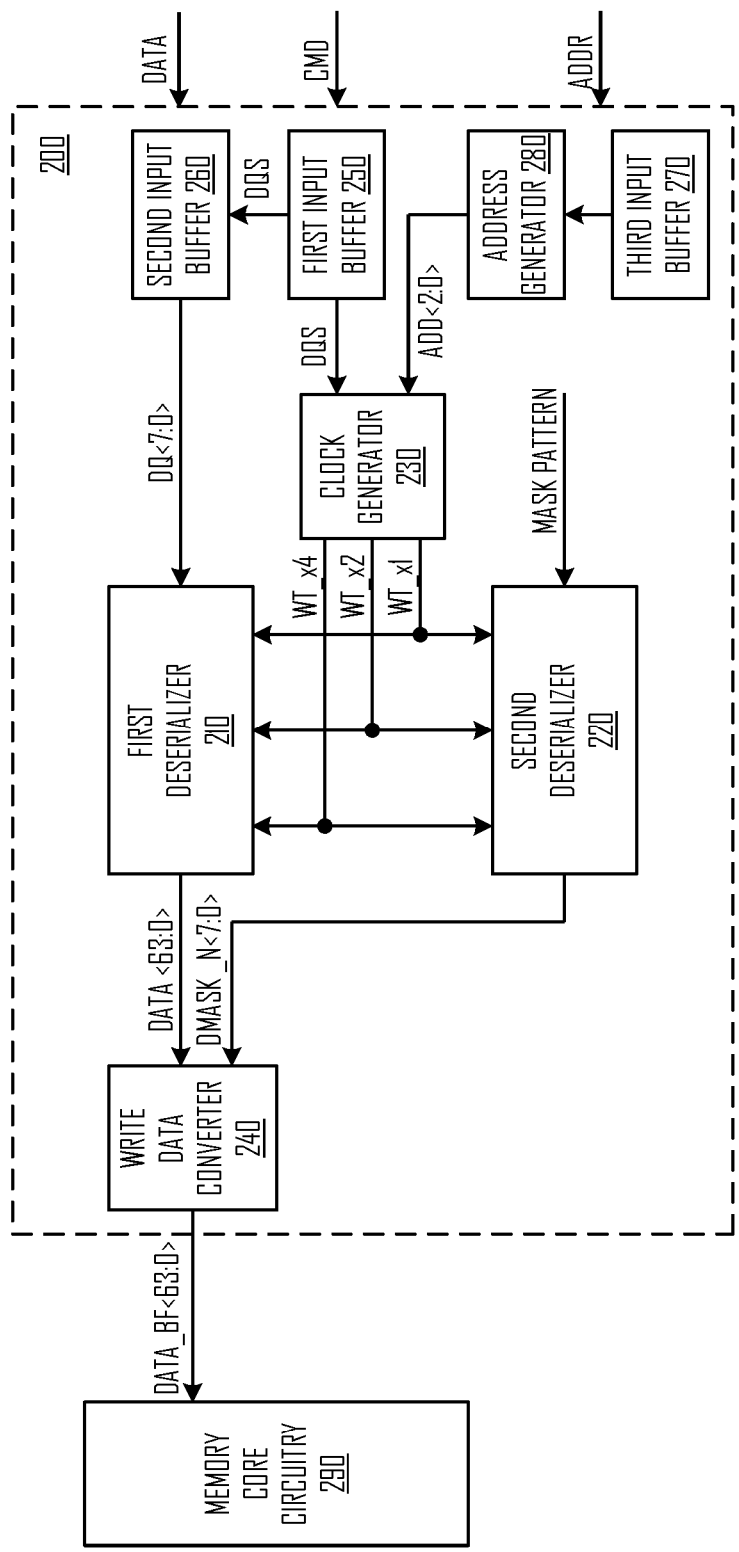
FIG. 2 is a functional block diagram of a data masking circuitry according to some embodiments of the disclosure.

FIG. 2 shows a functional block diagram of a data masking circuitry 200 (or peripheral circuitry) according to some examples of the disclosure. The data masking circuitry 200 is coupled with a memory core circuitry 290. In an example, the memory core circuitry 290 includes memory cells, and the data masking circuitry 200 can mask a portion of data to be written to the memory cells in the memory core circuitry 290 during a write operation.

In some examples, the data masking circuitry 200 and the memory core circuitry 290 are within a semiconductor memory device. In an example, the semiconductor memory device includes a single die, and the data masking circuitry 200 and the memory core circuitry 290 are disposed on the single die. In another example, the semiconductor memory device includes multiple dies that are bonded together, and one of the dies includes pads that interface the semiconductor memory device with external circuitry, and is referred to as interface die in an example. The data masking circuitry 200 is disposed on the interface die in some examples. In an example, the semiconductor memory device can include a three-dimensional NAND Flash memory device.

In the FIG. 2 example, the data masking circuitry 200 can include a first deserializer 210, a second deserializer 220, and a write data converter 240 coupled together as shown in FIG. 2. In some examples, the first deserializer 210 outputs parallel data, e.g., DATA<63:0>, and the second deserializer 220 outputs a mask pattern, e.g., DMASK_N<7:0>. The first deserializer 210 and the second deserializer 220 can have a same circuit structure, and can be configured to have matching timing characteristics, thus the parallel data and the mask pattern can arrive at the write data converter 240 with time aligned. The data masking circuitry 200 can be used in a high speed memory system, thus the high speed memory system has no need to compromise the overall operation speed due to timing alignment of the parallel data and the mask pattern.

Specifically, in some examples, the first deserializer 210 is configured to convert serial data, e.g., DQ<7:0>, to parallel data, e.g., DATA<63:0>, with a first timing alignment based on a set of write clock signals, e.g., a first write clock signal WT_x1, a second write clock signal WT_x2 and a third write clock signal WT_x4. Further, in some examples, the second deserializer 220 is configured to convert a serial mask pattern, e.g., MASK PATTERN, to the mask pattern DMASK_N<7:0> with a second timing alignment based on the set of write clock signals, e.g., the first write clock signal WT_x1, the second write clock signal WT_x2 and the third write clock signal WT_x4. In an example, the serial mask pattern MASK PATTERN is provided in the form of a power supply voltage, such as a high voltage supply VDD, a ground level supply voltage, and the like. In another example, the serial mask pattern MASK PATTERN can be output from a mask register circuitry, such as the mask register circuitry 120 in FIG. 1.

In some examples, the first timing alignment and the second timing alignment based on the same set of write clock signals can allow the mask pattern DMASK_N<7:0> being time-aligned with the parallel data DATA<63:0>. In an example, the second deserializer 220 and the first deserializer 210 are formed based on a same circuit structure. An example of the circuit structure will be described with reference to FIG. 3.

In some examples, the second deserializer 220 and the first deserializer 210 are configured to have matching timing characteristics. In an example, the second deserializer 220 and the first deserializer 210 are configured to have matching transistor delays. For example, corresponding transistors (of the same circuit structure) in the second deserializer 220 and the first deserializer 210 are configured to have the same sizes within manufacturing variations. In another example, the second deserializer 220 and the first deserializer 210 are configured to have matching wire delays. For example, corresponding connection wires in the second deserializer 220 and the first deserializer 210 are configured to have same width and same length within manufacturing variations.

In the FIG. 2 example, the write data converter 240 can be configured to generate valid data, e.g., DATA_BF<63:0>, based on the parallel data DATA<63:0> and the mask pattern DMASK_N<7:0>. For example, the write data converter 240 can convert the parallel data DATA<63:0> and generate the valid data DATA_BF<63:0> based on the mask pattern DMASK_N<7:0>, i.e., controlling masking or unmasking of data bits of the parallel data DATA<63:0> in accordance with the mask pattern DMASK_N<7:0>, and output the valid data DATA_BF<63:0> to the memory core circuitry 290. In an embodiment, the write data converter 240 can perform a logic operation on the parallel data DATA<63:0> and the mask pattern DMASK_N<7:0>. For example, the logic operator can be OR, AND or XOR operation. In another embodiment, the write data converter 240 can perform the logic operation on each of bits of the parallel data DATA<63:0> and a corresponding one of bits of the mask pattern DMASK_N<7:0>.

In the FIG. 2 example, the data masking circuitry 200 further includes a first input buffer 250, a second input buffer 260, a third input buffer 270 and an address generator 280. For example, the first input buffer 250 can be configured to receive and shape a data strobe signal DQS. In another example, the second input buffer 260 can be configured to sample and buffer input data DATA, in synchronization with transitions of the data strobe signal DQS from the first input buffer 250. In an example, the input data DATA is received on 8 pins, the second input buffer 260 includes eight buffers to respectively sample and buffer signals on the 8 pins, and the second input buffer 260 can output the serial data on each of 8 paths, the serial data on the 8 paths are shown by DQ<7:0>. The data strobe signal DQS can thus be used to synchronize the sampling of the input data DATA to generate the serial data DQ<7:0>.

It is noted that the serial data DQ<7:0> includes 8 bitstreams in parallel, and each bitstream of the 8 bitstreams is a bitstream of serial data.

The third input buffer 270 can be configured to sample and buffer an address signal ADDR. It is noted that when the address signal is received on multiple pins, the third input buffer 270 can include multiple buffer circuitry to respectively sample and buffer signals on the multiple pins.

According to an aspect of the disclosure, the first deserializer 210 and the second deserializer 220 are configured to operate based on a same set of write clock signals, and the write clock signals can be generated with a timing pattern for controlling the loading time of the parallel data DATA<63:0> and the mask pattern DMASK_N<7:0> to the write data converter 240. The address generator 280 can be configured to generate a loading timing signal in accordance with the address signal ADDR. For example, the address generator 280 can generate the loading timing signal using three least significant bits of the address signal ADDR, e.g., ADD<2:0>. In an embodiment, the loading timing signal ADD<2:0> can be used to control a time at which the parallel data DATA<63:0> and the mask pattern DMASK_N<7:0> are loaded to the write data converter 240.

In an embodiment, the data masking circuitry 200 can further include a clock generator 230. For example, the clock generator 230 can be coupled to the first input buffer 250, the address generator 280, the first deserializer 210 and the second deserializer 220. In an embodiment, the clock generator 230 can be configured to generate the set of write clock signals, e.g., the first write clock signal WT_x1, the second write clock signal WT_x2 and the third write clock signal WT_x4, in accordance with the data strobe signal DQS (or a basis clock signal that is in synchronization with the data strobe signal DQS) and the loading timing signal ADD<2:0>.

It is noted that some other components (not shown), such as a row decoder, a column decoder, page buffers and the like are in a semiconductor memory device that includes the data masking circuitry 200.

Figure 3:
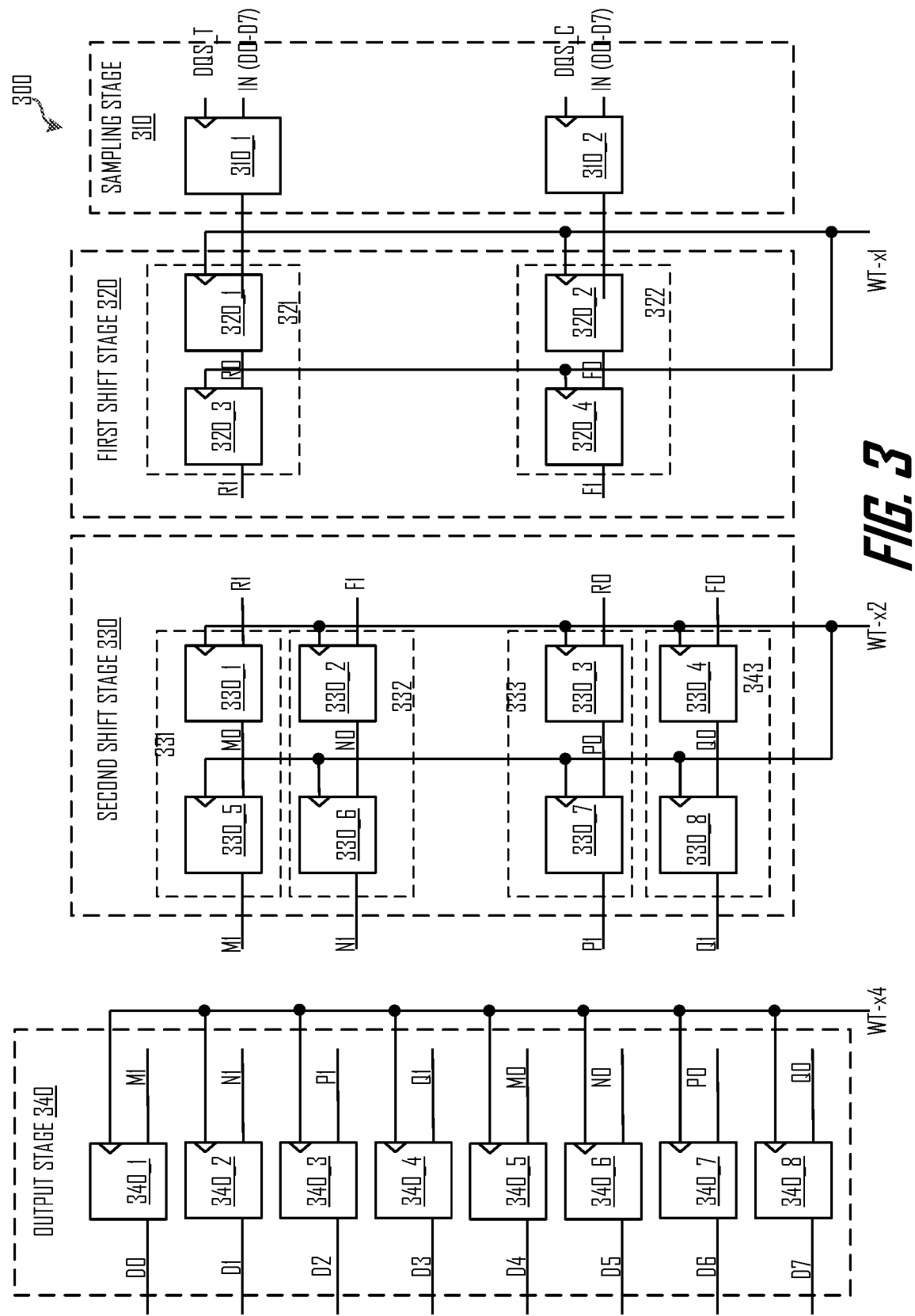
FIG. 3 is a functional block diagram of a deserializer according to some embodiments of the disclosure.

FIG. 3 shows a block diagram of a deserializer circuit structure 300 according to some aspects of the disclosure. In some examples, the first deserializer 210 and the second deserializer 220 in FIG. 2 can be implemented using the deserializer circuit structure 300. The deserializer circuit structure 300 is configured to deserialize an input bitstream IN into 8 parallel bitstreams D0-D7. The 8 parallel bitstreams D0-D7 respectively have ⅛ bit rate of the input bitstream IN. The input bitstream IN is referred to as serial data, and the 8 parallel bitstreams D0-D7 are referred to as parallel data.

In an example, the first deserializer 210 includes 8 copies of the deserializer circuit structure 300 that respectively deserialize each of DQ<7:0>, and generate 64 parallel bitstreams DATA<63:0> for example. In another example, the second deserializer 220 includes a copy of the deserializer circuit structure 300 that deserializes the serial mask pattern and generates 8 parallel bits of the mask pattern.

For ease of description, the input bitstream IN is assumed to have 8 serial bits, and the input bitstream IN is deserialized to generate 8 parallel bits by the deserializer circuit structure 300.

In the FIG. 3 example, the deserializer circuit structure 300 includes a sampling stage 310, a first shift stage 320, a second shift stage 330, and an output stage 340 coupled together as shown in FIG. 3.

The sampling stage 310 can sample the input bitstream IN based on a data strobe signal. In an embodiment, the sampling stage 310 can include a first D flip-flop 310_1 and a second D flip-flop 310_2. The first D flip-flop 310_1 can sample the input bitstream IN based on a first data strobe signal DQS_T. The second D flip-flop 310_2 can sample the input bitstream IN based on a second data strobe signal DQS_C. In some examples, the first data strobe signal DQS_T and the second data strobe signal DQS_C have a same sampling rate that is referred to as base rate. The second data strobe signal DQS_C is phase shifted from the first data strobe signal DQS_T by for example 180°. For example, the input bitstream IN includes 8 bits of data that are transmitted at a doubled rate of the base rate. In an example, the first D flip-flop 310_1 can sample the first, third, fifth and seventh bits of the input bitstream IN (e.g., D0, D2, D4 and D6), for example, in response to the first, second, third and fourth rising edges of the first data strobe signal DQS_T, respectively, and the second D flip-flop 310_2 can sample the second, fourth, sixth and eighth data bits of input bitstream IN (e.g., D1, D3, D5 and D7), for example, in response to first, second, third and fourth rising edges of the second data strobe signal DQS_C, respectively. The data bits sampled by the sampling stage 310 are forwarded to the first shift stage 320.

The first shift stage 320 includes cascaded shift register paths 321-322 coupled to the sampling stage 310 to shift the sampled data bits based on a first write clock signal (e.g., WT_x1) and generate intermediate parallel data at nodes R0, F0, R1 and F1. For example, the first shift stage 320 includes a first cascaded shift register path 321 coupled to the first D flip-flop 310_1 to shift the sampled data bits by the first D flip-flop 310_1, such as the first, third, fifth and seventh bits of the input bitstream IN (e.g., D0, D2, D4 and D6) based on a first write clock signal (e.g., WT_x1) and generate intermediate parallel data at nodes R0, and R1. Further, the first shift stage 320 includes a second cascaded shift register path 322 coupled to the second D flip-flop 310_2 to shift the sampled data bits by the second D flip-flop 310_2, such as the second, fourth, sixth and eighth data bits of the input bitstream IN (e.g., D1, D3, D5 and D7) based on the first write clock signal (e.g., WT_x1) and generate intermediate parallel data at nodes F0, and F1. In some examples, the first write clock signal WT_x1 can be generated based on the first data strobe signal DQS_T and the second data strobe signal DQS_C, such as have a same frequency as the first data strobe signal DQS_T and the second data strobe signal DQS_C, and the rising edges of the first write clock signal WT_x1 can be configured to have a suitable phase shift with regard to rising edges of the first data strobe signal DQS_T and the second data strobe signal DQS_C.

In an embodiment, the first cascaded shift register path 321 includes a first D flip-flop 320_1, and a third D flip-flop 320_3 cascaded to the first D flip-flop 320-1, and the second cascaded shift register path 322 includes a second D flip-flop 320_2 and a fourth D flip-flop 320_4 cascaded to the second D flip-flop 320-2. The first D flip-flop 320_1, the second D flip-flop 320_2, the third D flip-flop 320_3 and the fourth D flip-flop 320_4 can be triggered by the first write clock signal WT_x1. For example, at the first rising edge of the first write clock signal WT_x1, the first D flip-flop 320_1 and the second D flip-flop 320_2 can shift the first and second bits (e.g., D0 and D1) of the input bitstream IN, respectively; and at the second rising edge of the first write clock signal WT_x1, the third D flip-flop 320_3 and the fourth D flip-flop 320_4 can shift the first and second bits of the input bitstream IN, respectively, and the first D flip-flop 320_1 and the second D flip-flop 320_2 can shift the third and fourth bits (e.g., D2 and D3) of the input bitstream IN, respectively, thus generating the first intermediate parallel data D0, D1, D2, and D3 at nodes R1, F1, R0, and F0, respectively Further, at the third rising edge of the first write clock signal WT_x1 the first D flip-flop 320_1 and the second D flip-flop 320_2 can shift the fifth and sixth bits (e.g., D4 and D5) of the input bitstream IN, respectively; and at the fourth rising edge of the first write clock signal WT_x1 the third D flip-flop 320_3 and the fourth D flip-flop 320_4 can shift the fifth and sixth bits of the input bitstream, respectively, and the first D flip-flop 320_1 and the second D flip-flop 320_2 can shift the seventh and eighth bits (e.g., D6 and D7) of the input bitstream, respectively, thus generating the second intermediate parallel data D4, D5, D6, and D7 at nodes R1, F1, R0, and F0 respectively.

The second shift stage 330 can be configured to form parallel cascaded shift register paths 331-334 to shift the intermediate parallel data (e.g., D0D1D2D3 and D4D5D6D7) based on a second write clock signal (e.g., WT_x2) and generate parallel data (e.g., D0-D7) at nodes M1, N1, P1, Q1, M0, N0, P0 and Q0 respectively. For example, the second write clock signal WT_x2 can have a period two times a period of the first write clock signal WT_x1. In other words, the frequency of the second write clock signal WT_x2 is one half of the first write clock signal WT_x1. In an embodiment, the second shift stage 330 can include four cascaded shift register paths 331-334 that respectively shift the intermediate parallel data. For example, a first cascaded shift register path 331 includes a first D flip-flop 330_1 and a fifth D flip-flop 330_5 cascaded to the first D flip-flop 330_1; a second cascaded shift register path 332 includes a second D flip-flop 330_2 and a sixth D flip-flop 330_6 cascaded to the second D flip-flop 330_2; a third cascaded shift register path 333 includes a third D flip-flop 330_3 and a seventh D flip-flop 330_7 cascaded to the third D flip-flop 330-3; and a fourth cascaded shift register path 334 includes a fourth D flip-flop 330_4, and an eighth D flip-flop 330_8 cascaded to the fourth D flip-flop 330-4. The first D flip-flop 330_1, the second D flip-flop 330_2, the third D flip-flop 330_3, the fourth D flip-flop 330_4, the fifth D flip-flop 330_5, the sixth D flip-flop 330_6, the seventh D flip-flop 330_7 and the eighth D flip-flop 330_8 can be triggered by the second write clock signal WT_x2. For example, at the first rising edge of the second write clock signal WT_x2, the first D flip-flop 330_1, the second D flip-flop 330_2, the third D flip-flop 330_3 and the fourth D flip-flop 330_4 can shift the first to fourth bits (e.g., D0D1D2D3) of the input bitstream IN, respectively; and at the second rising edge of the second write clock signal WT_x2 the fifth D flip-flop 330_5, the sixth D flip-flop 330_6, the seventh D flip-flop 330_7 and the eighth D flip-flop 330_8 can shift the first to fourth bits of the input bitstream IN, respectively, and the first D flip-flop 330_1, the second D flip-flop 330_2, the third D flip-flop 330_3 and the fourth D flip-flop 330_4 can shift the fifth to eighth bits (e.g., D4D5D6D7) of the input bitstream IN, respectively, thus generating the parallel data e.g., D0, D1, D2, D3, D4, D5, D6, and D7 at nodes M1. N1, P1, Q1, M0, N0, P0 and Q0, respectively.

The output stage 340 can be configured to output the parallel data based on a third write clock signal (e.g., WT_x4). For example, the third write clock signal WT_x4 can have a period two times the period of the second write clock signal WT_x2. In other words, the frequency of the third write clock signal WT_x3 is one half of the second write clock signal WT_x2, and is one fourth of the first write clock signal WT_x1. In an embodiment, the output stage 340 can include a first D flip-flop 340_1, a second D flip-flop 340_2, a third D flip-flop 340_3, a fourth D flip-flop 340_4, a fifth D flip-flop 340_5, a sixth D flip-flop 340_6, a seventh D flip-flop 340_7 and an eighth D flip-flop 340_8 that are triggered by the third write clock signal WT_x4. For example, at the first rising edge of the third write clock signal WT_x4, the first D flip-flop 340_1, the second D flip-flop 340_2, the third D flip-flop 340_3, the fourth D flip-flop 340_4, the fifth D flip-flop 340_5, the sixth D flip-flop 340_6, the seventh D flip-flop 340_7 and the eighth D flip-flop 340_8 can shift the parallel data e.g., D0, D1, D2, D3, D4, D5, D6, and D7 at the nodes M1, N1, P1, Q1, M0, N0, P0 and Q0, respectively, and output the parallel data D0-D7.

Figure 4:
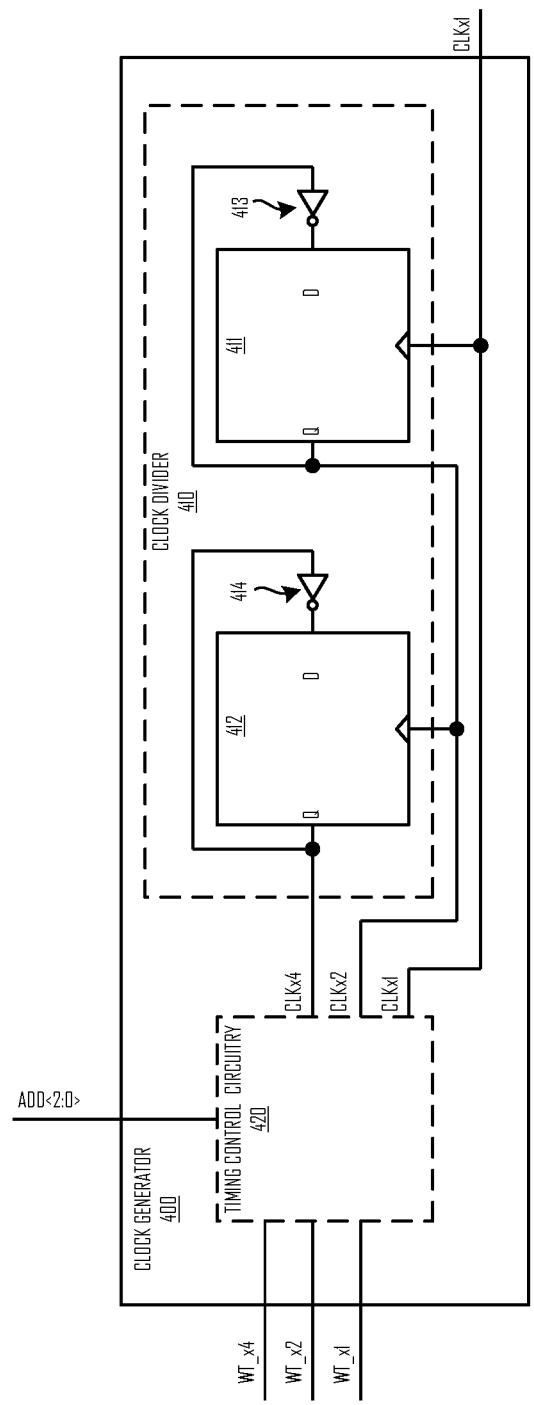
FIG. 4 is a functional block diagram of a clock generator according to some embodiments of the disclosure.

FIG. 4 is a functional block diagram of a clock generator 400 according to some embodiments of the disclosure. In an example, the clock generator 230 is implemented according to the clock generator 400. In the FIG. 4 example, the clock generator 400 can include a clock divider 410 and a timing control circuitry 420 coupled to the clock divider 410. In an embodiment, the clock divider 410 can include a first D flip-flop 411, a first inverter 413 that feeds a Q terminal of the first D flip-flop 411 back to a D terminal of the first D flip-flop 411, a second D flip-flop 412, and a second inverter 414 that feeds a Q terminal of the second D flip-flop 412 back to a D terminal of the second D flip-flop 412. The first D flip-flop 411 can be triggered by an x1 clock signal CLKx1, and the second D flip-flop 412 can be triggered by a signal output at the Q terminal of the first D flip-flop 411. For example, the first D flip-flop 411 and the second D flip-flop 412 can be single-edge triggered. In an embodiment, the x1 clock signal CLKx1 can be in synchronization with the data strobe signal DQS. Prior to operation, the clock divider 410 can be cleared by, for example, an active low signal, which can clear both of the first D flip-flop 411 and the second D flip-flop 412 within the clock divider 410.

In operation, at the first rising edge of the x1 clock signal CLKx1, a signal at the Q terminal of the first D flip-flop 411 becomes high as a signal at the D terminal of the first D flip-flop 411 is high after the first D flip-flop 411 is cleared by the active low signal, and the signal at the D terminal of the first D flip-flop 411 becomes low; at the second rising edge of the x1 clock signal CLKx1 the signal at the Q terminal of the first D flip-flop 411 becomes low and the signal at the D terminal of the first D flip-flop 411 becomes high; and at the third rising edge of the x1 clock signal CLKx1 the signal at the Q terminal of the first D flip-flop 411 returns to high and the signal at the D terminal of the first D flip-flop 411 returns to low. Therefore, the x1 clock signal CLKx1 can have a frequency two times a frequency of the signal at the Q terminal of the first D flip-flop 411, or the signal at the Q terminal of the first D flip-flop 411, i.e., an x2 clock signal CLKx2, can have a period two times a period of the x1 clock signal CLKx1. Similarly, a signal at the Q terminal of the second D flip-flop 412, i.e., an x4 clock signal CLKx4, can have a period two times the period of the x2 clock signal CLKx2 and four times the period of the x1 clock signal CLKx1. In another embodiment, the clock divider 410 can replace the first D flip-flop 411 and the second D flip-flop 412 with two cascaded J-K or two cascaded T flip-flops, and the first inverter 413 and the second inverter 414 can thus be omitted.

The timing control circuitry 420 can generate a set of write clock signals, e.g., the first write clock signal WT_x1, the second write clock signal WT_x2 and the third write clock signal WT_x4, by combining the x1 clock signal CLKx1, the x2 clock signal CLKx2 and the x4 clock signal CLKx4 generated by the clock divider 410 in accordance with the loading timing signal, e.g., ADD<2:0>. For example, the timing control circuitry 420 can include a combination of a variety of timing and logic components, such as AND, OR and NOT, a multiplexer, a demultiplexer, a flip-flop, etc.

Figure 5:
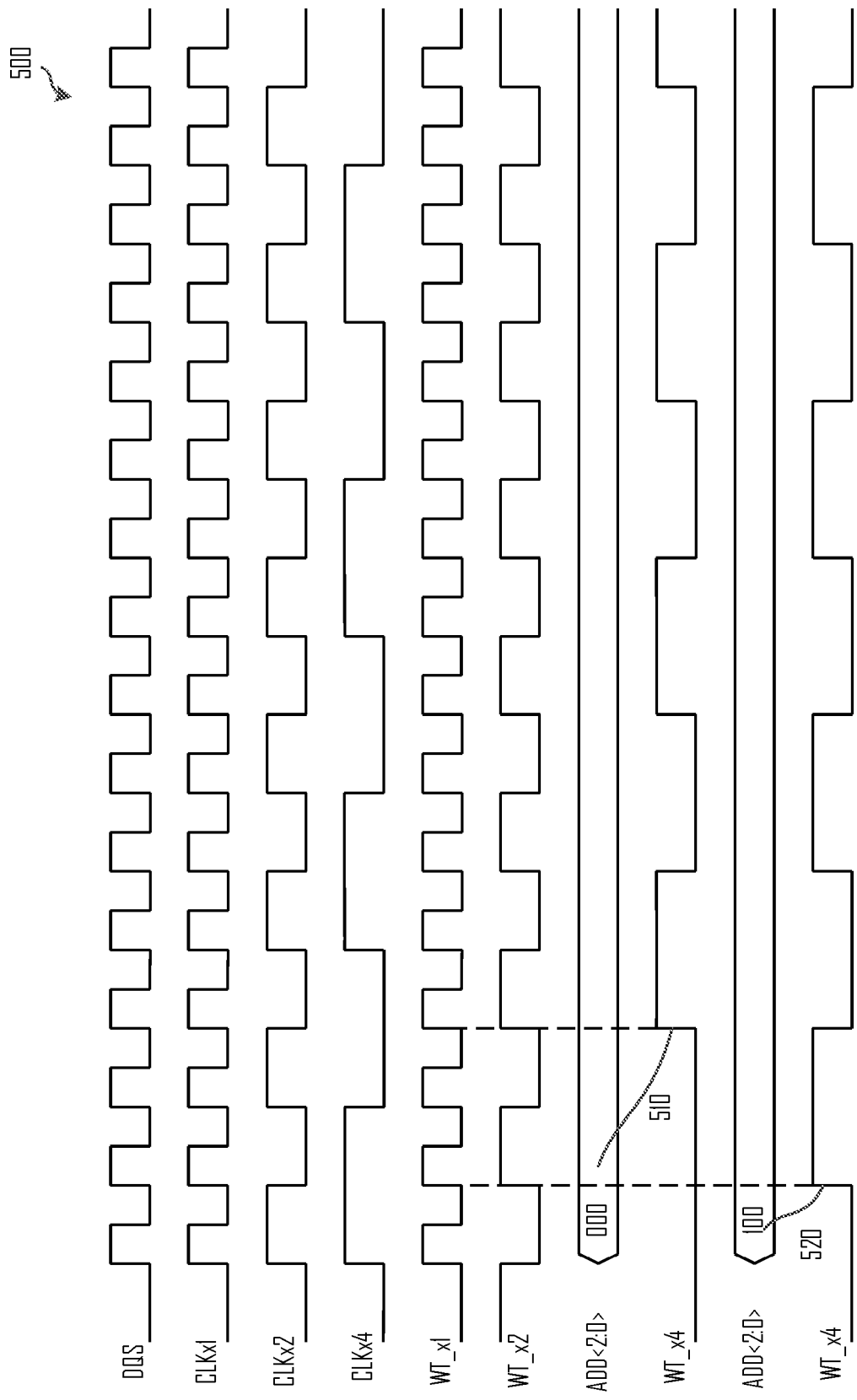
FIG. 5 is a timing diagram illustrating operations of a clock generator shown according to some embodiments of the disclosure.

FIG. 5 is a timing diagram 500 illustrating the operation of the clock generator 400 according to some embodiments of the disclosure. As shown in the timing diagram 500, the x1 clock signal CLKx1 can be in synchronization with the data strobe signal DQS, the clock divider 410 can generate the x2 clock signal CLKx2 that has a period two times a period of the x1 clock signal CLKx1, and the x4 clock signal CLKx4 that has a period four times the period of the x1 clock signal CLKx1, and the timing control circuitry 420 can generate the first write clock signal WT_x1 that is in synchronization with the x1 clock signal CLKx1, the second write clock signal WT_x2 by inverting the x2 clock signal CLKx2, and the third write clock signal WT_x4 in accordance with the start load location signal ADD<2:0>. The timing diagram 500 shown in FIG. 5 shows that the third write clock signal WT_x4 can start after three cycles of the first write clock signal WT_x1 elapses when the loading timing signal ADD<2:0> is "000," as shown by 510 and can start after one cycle of the first write clock signal WT_x1 elapses when the loading timing signal ADD<2:0> is "100," as shown by 520. According to some other embodiments of the disclosure, the third write clock WT_x4 can start after two and a half, two, and one and a half cycles of the first write clock signal WT_x1 elapses when the start load location signal ADD<2:0> is "001," "010," and "011," respectively.

Figure 6:
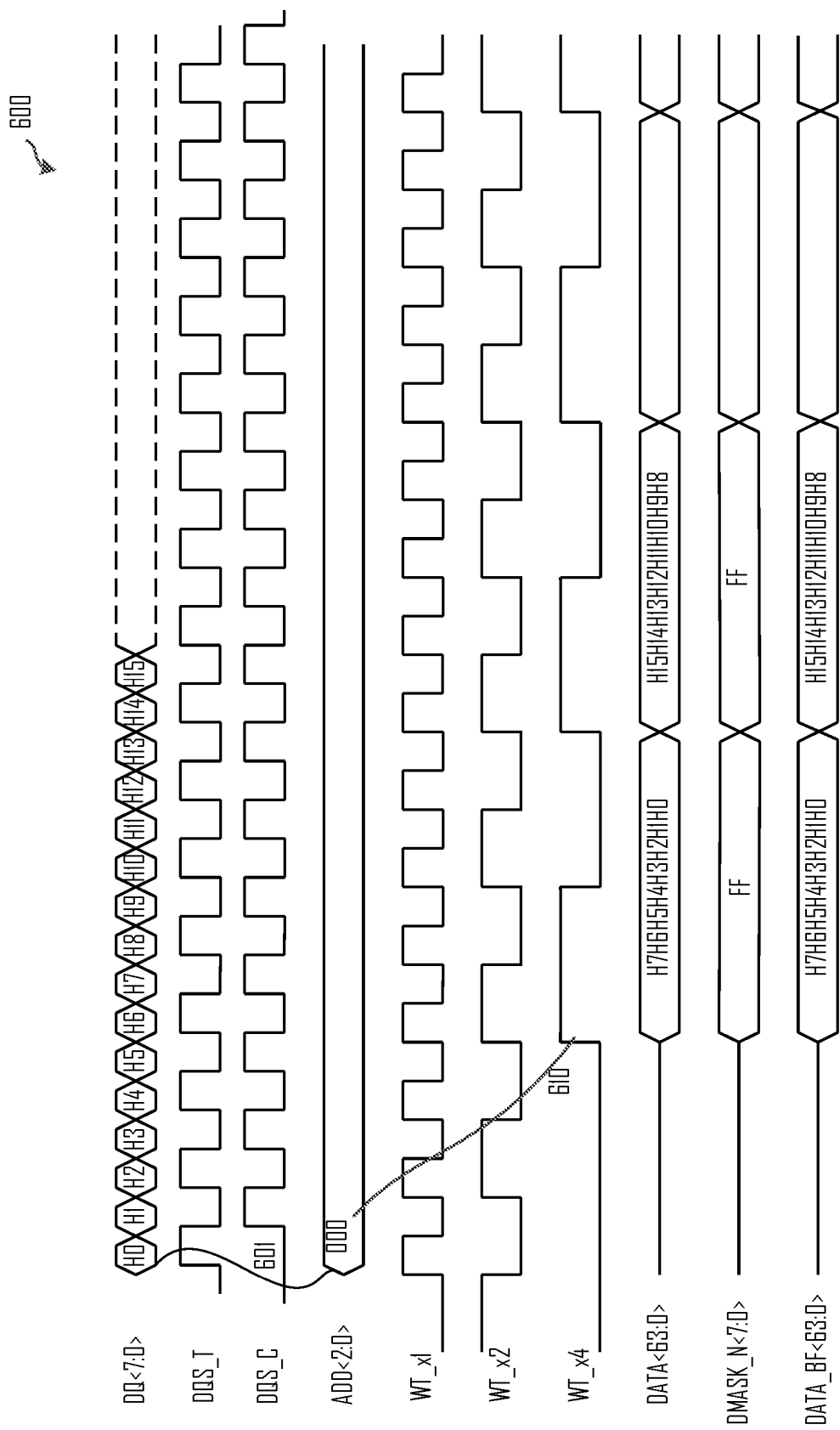
FIG. 6 is a timing diagram illustrating operations of a data masking circuitry according to some embodiments of the disclosure.

FIG. 6 is an exemplary timing diagram 600 illustrating the operations of a data masking circuitry, such as the data masking circuitry 200, according to some embodiments of the disclosure. In an embodiment, the first deserializer 210 includes eight copies of the deserializer circuit structure 300 to respectively deserialize 8 bitstreams DQ<7:0>, and the second deserializer 220 includes a copy of the deserializer circuit structure 300 to deserialize a serial mask pattern. The first deserializer 210 and the second deserializer 220 can be triggered by the same set of write clock signal, e.g., the first write clock signal WT_x1, the second write clock signal WT_x2 and the third write clock signal WT_x4. For example, the first shift stage 320 can be triggered by the first write clock signal WT_x1, and the second shift stage 330 can be triggered by the second write clock signal WT_x2, and the output stage 340 can be triggered by the third write clock signal WT_x4.

In some examples, the clock generator 230 is implemented according to the clock generator 400. Thus, the clock divider 410 can generate the x1 clock signal CLKx1, the x2 clock signal CLKx2 and the x4 clock signal CLKx4 based on a basis clock signal (e.g., in synchronization with the data strobe signal), and the timing control circuitry 420 can generate the set of write clock signals, e.g., the first write clock signal WT_x1, the second write clock signal WT_x2 and the third write clock signal WT_x4, by combining the x1 clock signal CLKx1, the x2 clock signal CLKx2 and the x4 clock signal CLKx4 in accordance with the start load location signal ADD<2:0>. For example, the basis clock signal can be in synchronization with the data strobe signal DQS (e.g., the data strobe signal DQS_T and the data strobe signal DQS_C).

In an embodiment, the loading timing signal ADD<2:0> can indicate a starting position in a bitstream for writing, and can indicate page buffer that do not need to be reloaded. In some examples, the first write clock signal WT_x1, the second write clock signal WT_x2 and the third write clock signal WT_x4 are generated based on the loading timing signal ADD<2:0>, and the first write clock signal WT_x1, the second write clock signal WT_x2 and the third write clock signal WT_x4 control the deserializer circuit structure 300 to shift bits in a bitstream and form parallel data.

In the FIG. 6 example, DQ<7:0> denotes 8 parallel bitstreams, and each bitstream includes a serial stream of binary data. For example, H0 denotes 8 parallel bits respectively being the first bits of the 8 parallel bitstreams; H1 denotes 8 parallel bits respectively being the second bits of the 8 parallel bitstreams; H2 denotes 8 parallel bits respectively being the third bits of the 8 parallel bitstreams; H3 denotes 8 parallel bits respectively being the fourth bits of the 8 parallel bitstreams, and so on. In some examples, H0 is referred with reference to a settling time of the address signal, such as the ADD<2:0>. For example, H0 is the first 8 parallel bits from the 8 parallel input bitstream DQ<7:0> in response to ADD<2:0> being settled, as shown by 601.

In the FIG. 6 example, DATA<64:0> denotes 64 parallel bitstreams that are generated by deserializing DQ<7:0>; DMASK_N<7:0> denotes 8 parallel bits, "FF" denotes the hexadecimal of the 8 parallel binary bits "11111111"; DATA_BF<63:0> denotes 64 parallel bitstream of valid data that is a combination of DATA<64:0> with DMASK_N<7:0>. For example, each bit in serial mask pattern has a corresponding bit in each of the 8 parallel bitstreams. Thus, a first bit DMASK_N<0:0> in DMASK_N<7:0> is used to mask the first 8 bits DATA<7:0> of DATA<64:0>; a second bit DMASK_N<1:1> is used to mask the second 8 bits DATA<15:8>; a third bit DMASK_N<2:2> is used to mask the third 8 bits DATA<23:16>; a fourth bit DMASK_N<3:3> is used to mask the fourth 8 bits DATA<31:24>; a fifth bit DMASK_N<4:4> is used to mask the fifth 8 bits DATA<39:32>; a sixth bit DMASK_N<5:5> is used to mask the sixth 8 bits DATA<47:40>; a seventh bit DMASK_N<6:6> is used to mask the seventh 8 bits DATA<55:48>; and an eighth bit DMASK_N<7:7> is used to mask the eighth 8 bits DATA<63:56>.

In the FIG. 6 example, the loading timing signal ADD<2:0> is "000", and the timing patterns of the first write clock signal WT_x1, the second write clock signal WT_x2 and the third write clock signal WT_x4 are generated based on the loading timing signal ADD<2:0> as shown by 610. The timing diagram 600 of FIG. 6 shows that the first write clock signal WT_x1 can be in synchronization with the basis clock signal, i.e., the x1 clock signal CLKx1 generated by the clock divider 410, which is in synchronization with the data strobe signal DQS_T and/or the data strobe signal DQS_C.

In the FIG. 6 example, the basis clock signal or the data strobe signal DQS_T and/or the data strobe signal DQS_C have a base clock rate (also referred to as sampling rate in the context of data sampling), and the DQ<7:0> are transmitted at a doubled rate of the base clock rate. The data strobe signal DQS_T and the data strobe signal DQS_C have the same sampling rate and have a phase shift of about 180° of each other. The data strobe signal DQS_T and the data strobe signal DQS_C are used to sample the DQ<7:0> for example, using the circuit structure in the sampling stage 310. For example, in response to rising edges of the data strobe signal DQS_T, H0, H2, H4, H6, H8, H10, H12, H14 . . . are sampled respectively; and in response to rising edges of the data strobe signal DQS_C, H1, H3, H5, H7, H9, H11, H13, H15 . . . are sampled respectively.

The first write clock signal WT_x1 is used in, for example, the first shift stage 320 of the eight copies of the deserializer circuit structure 300 to respectively deserialize 8 bitstreams DQ<7:0>, the second write clock signal WT_x2 is used in, for example, the second shift stage 330 of the eight copies of the deserializer circuit structure 300 to respectively deserialize 8 bitstreams DQ<7:0>, and the third write clock signal WT_x4 is used in, for example, the output stage 340 of the eight copies of the deserializer circuit structure 300 to respectively deserialize 8 bitstreams DQ<7:0>.

The first write clock signal WT_x1 is used in, for example, the first shift stage 320 of the deserializer circuit structure 300 to deserialize the serial mask pattern, the second write clock signal WT_x2 is used in, for example, the second shift stage 330 of the deserializer circuit structure 300 to deserialize the serial mask pattern, and the third write clock signal WT_x4 is used in, for example, the output stage 340 of the deserializer circuit structure 300 to deserialize the serial mask pattern.

In the FIG. 6 example, in response to the first rising edge of the third write clock signal WT_x4, the output stage 340 of the eight copies of the deserializer circuit structure 300 to respectively deserialize 8 bitstreams DQ<7:0> can output the 64 parallel bits in DATA<63:0>, such as shown by "H7H6H5H4H3H2H1H0"; and in response to the first rising edge of the third write clock signal WT_x4, the output stage 340 of the deserializer circuit structure 300 to deserialize the serial mask pattern can output 8 bits in DMASK_N<7:0>, such as shown by "FF". The 64 parallel bits in DATA<63:0> and the 8 bits in DMASK_N<7:0> are combined to generate 64 parallel bits in DATA_BF<63:0>, as shown by "H7H6H5H4H3H2H1H0". For example, DMASK_N<0:0> is associated with H0 (DATA<7:0>), and a logic AND operation can be performed respectively on each bit of DATA<7:0> with DMASK_N<0:0>.

In the FIG. 6 example, in response to the second rising edge of the third write clock signal WT_x4, the output stage 340 of the eight copies of the deserializer circuit structure 300 to respectively deserialize 8 bitstreams DQ<7:0> can output the 64 parallel bits in DATA<63:0>, such as shown by "H15H14H13H12H11H10H9H8"; and in response to the second rising edge of the third write clock signal WT_x4, the output stage 340 of the deserializer circuit structure 300 to deserialize the serial mask pattern can output 8 bits in DMASK_N<7:0>, such as shown by "FF". The 64 parallel bits in DATA<63:0> and the 8 bits in DMASK_N<7:0> are combined to generate 64 parallel bits in DATA_BF<63:0>, as shown by "H15H14H13H12H11H10H9H8". For example, DMASK_N<0:0> is associated with H8, and a logic AND operation can be performed respectively on each bit of H8 with DMASK_N<0:0>.

Figure 7:
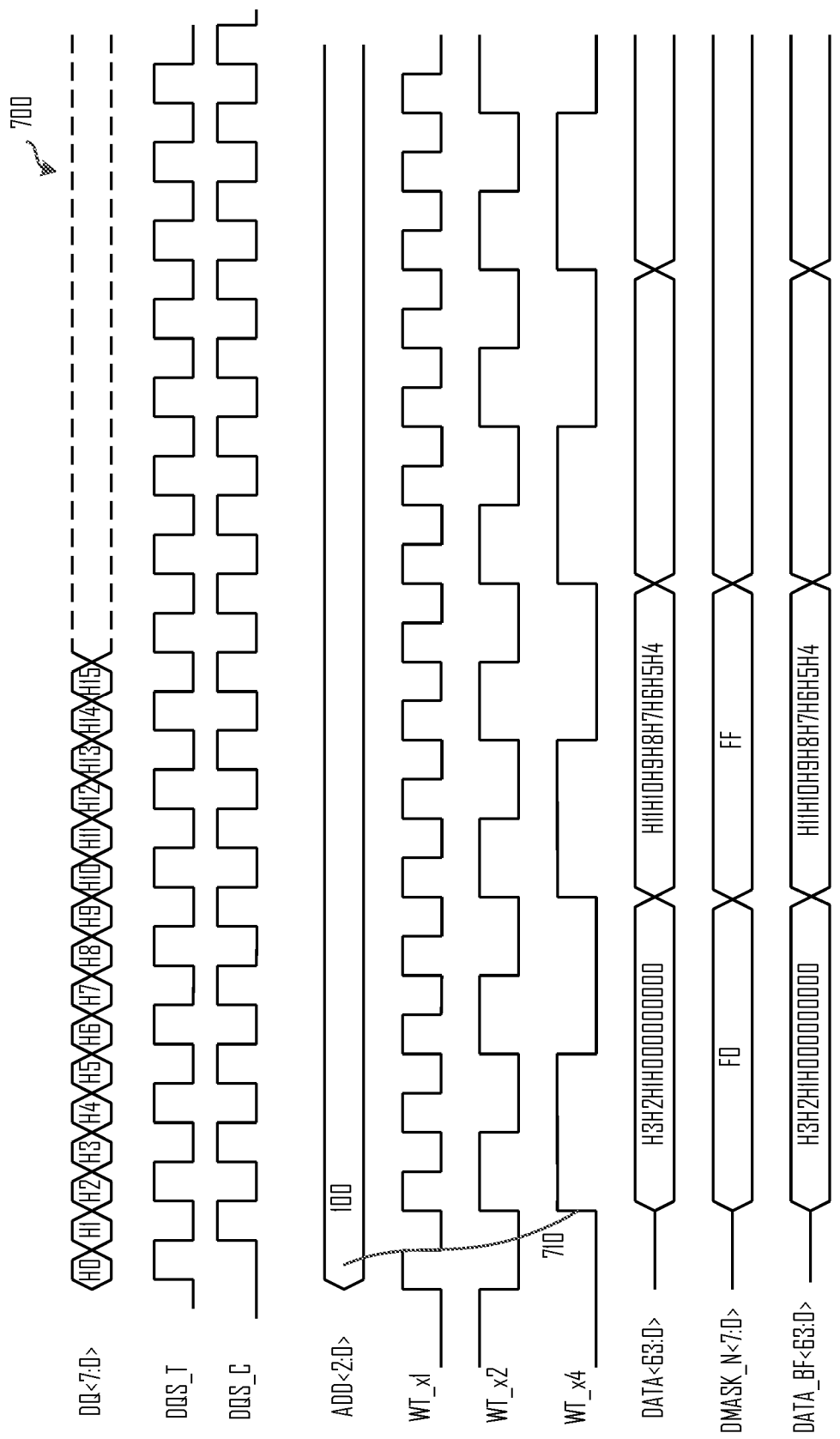
FIG. 7 is another timing diagram illustrating operations of a data masking circuitry according to some embodiments of the disclosure.

FIG. 7 is another timing diagram 700 according to some embodiments of the disclosure. FIG. 7 differs from FIG. 6 in that FIG. 6 shows the timing diagram of the data masking circuitry 200 in which the load timing signal ADD<2:0> is "000," while FIG. 7 shows the timing diagram of the data masking circuitry 200 in which the load timing signal ADD<2:0> is "100". In the FIG. 7 example, the loading timing signal ADD<2:0> is "100", and the timing patterns of the first write clock signal WT_x1, the second write clock signal WT_x2 and the third write clock signal WT_x4 are generated based on the loading timing signal ADD<2:0> as shown by 710.

In the FIG. 7 example, in response to the first rising edge of the third write clock signal WT_x4, the output stage 340 of the eight copies of the deserializer circuit structure 300 to respectively deserialize 8 bitstreams DQ<7:0> can output the 64 parallel bits in DATA<63:0>, such as shown by "H3H2H1H000000000"; and in response to the first rising edge of the third write clock signal WT_x4, the output stage 340 of the deserializer circuit structure 300 to deserialize the serial mask pattern can output 8 bits in DMASK_N<7:0>, such as shown by "F0". The 64 parallel bits in DATA<63:0> and the 8 bits in DMASK_N<7:0> are combined to generate 64 parallel bits in DATA_BF<63:0>, as shown by "H3H2H1H000000000". For example, DMASK_N<4:4> is associated with H0 (DATA<39:32>), and a logic AND operation can be performed respectively on each bit of DATA<39:32> with DMASK_N<4:4>.

In the FIG. 7 example, in response to the second rising edge of the third write clock signal WT_x4, the output stage 340 of the eight copies of the deserializer circuit structure 300 to respectively deserialize 8 bitstreams DQ<7:0> can output the 64 parallel bits in DATA<63:0>, such as shown by "H11H10H9H8H7H6H5H4"; and in response to the second rising edge of the third write clock signal WT_x4, the output stage 340 of the deserializer circuit structure 300 to deserialize the serial mask pattern can output 8 bits in DMASK_N<7:0>, such as shown by "FF". The 64 parallel bits in DATA<63:0> and the 8 bits in DMASK_N<7:0> are combined to generate 64 parallel bits in DATA_BF<63:0>, as shown by "H11H10H9H8H7H6H5H4". For example, DMASK_N<0:0> is associated with H4, and a logic AND operation can be performed respectively on each bit of H4 with DMASK_N<0:0>.

The loading timing signal ADD<2:0> can also be "001," "010," "011," "101," "110," or "111." The relationship among ADD<2:0>, DATA<63:0> and DMASK_N<7:0> at the first rising edge of the third write clock signal WT_x4, for example, can be shown in TABLE 1 as follows according to some embodiments of the disclosure. In TABLE 1, each of "H0", "H1", "H2", "H3", "H4", "H5", "H6", "H7" and "H8" denotes 8 parallel bits from the 8 parallel input bitstream DQ<7:0>. In some examples, "H0", "H1", "H2" "H3", "H4", "H5", "H6", "H7" and "H8" are referred with reference to a settling time of the ADD<2:0>. For example, "H0" is the first 8 parallel bits from the 8 parallel input bitstream DQ<7:0> in response to ADD<2:0> being settled. Further, "00", "FF", "FE", "FC", "F8", "F0", "E0", "C0" and "80" are values in hexadecimal (HEX). As shown in TABLE 1, in some examples, the ADD<2:0> can be used to control the start bit in a bitstream (e.g., each of 8 parallel bitstreams) for loading to the memory cells, and bits before the start bit do not need to be loaded to a page buffer. Further, in some examples, the mask pattern can be generated accordingly.

TABLE 1

| ADD<2:0>, HEX | DATA<63:0> | DMASK_N<7:0>, HEX |
|---|---|---|
| 0 | H7, H6, H5, H4, H3, H2, H1, H0 | FF |
| 1 | H6, H5, H4, H3, H2, H1, H0, 00 | FE |
| 2 | H5, H4, H3, H2, H1, H0, 00, 00 | FC |

TABLE 1-continued

| ADD<2:0>, HEX | DATA<63:0> | DMASK_N<7:0>, HEX |
|---|---|---|
| 3 | H4, H3, H2, H1, H0, 00, 00, 00 | F8 |
| 4 | H3, H2, H1, H0, 00, 00, 00, 00 | F0 |
| 5 | H2, H1, H0, 00, 00, 00, 00, 00 | E0 |
| 6 | H1, H0, 00, 00, 00, 00, 00, 00 | C0 |
| 7 | H0, 00, 00, 00, 00, 00, 00, 00 | 80 |

FIG. 8 is a flow chart illustrating a process 800 for masking data according to some embodiments of the disclosure. In various embodiments, some of the steps of the process 800 shown can be performed concurrently, or in a different order than shown, or can be substituted for by other process steps, or can be omitted. Additional process steps can also be performed as desired. Aspects of the process 800 can be implemented by peripheral circuitry, such as the data masking circuitry 200 illustrated in and describe with respect to the preceding figures.

At S810, serial data can be converted based on a set of write clock signals using a first deserializer, e.g., the first deserializer 210, to output parallel data. In an embodiment, the parallel data can have a first timing alignment with regard to the set of write clock signals, e.g., the first write data clock signal WT_x1, the second write data clock signal WT_x2 and the third write data clock signal WT_x4. In an embodiment, the set of write clock signals can be generated based on a data strobe signal. For example, the set of write clock signals can be output with a timing pattern based on three least significant bits of an address signal. As another example, a data strobe signal can be frequency-divided to generate a plurality of divided clock signals, and the set of write clock signals can be output with the timing pattern based on the divided clock signals.

At S820, a mask pattern can be output using a second deserializer, e.g., the second deserializer 220. In an embodiment, the mask pattern can have a second timing alignment with regard to the set of write clock signals. In an embodiment, the mask pattern can be time-aligned with the parallel data based on the first timing alignment and the second timing alignment. In an embodiment, the first deserializer and the second deserializer can be of the same circuit structure. In another embodiment, the second deserializer can be formed with matching timing characteristic to the first deserializer. For example, the second deserialize can be formed with matching transistor delays to the first deserializer. As another example, the second deserializer can be formed with matching wire delays to the first deserializer.

At step 830, the parallel data can be combined with the mask pattern to generate valid data.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first deserializer configured to convert serial data to parallel data with a first timing alignment with regard to a set of write clock signals;
   a second deserializer configured to generate a mask pattern with a second timing alignment with regard to the set of write clock signals; and
   a write data converter coupled to the first deserializer and the second deserializer, the write data converter configured to generate valid data based on the parallel data and the mask pattern, wherein the first deserializer outputs the parallel data and the second deserializer outputs the mask pattern at a same time,
   wherein the first deserializer and the second deserializer are configured to have a same circuit structure that includes:
      a sampling stage configured to sample a data input carrying the serial data based on a data strobe signal;
      a first shift stage including a cascaded shift register path configured to shift the sampled serial data based on a first write clock signal and generate intermediate parallel data;
      a second shift stage including parallel cascaded shift register paths to shift the intermediate parallel data based on a second write clock signal and generate the parallel data; and
      an output stage configured to output the parallel data based on a third write clock signal.

2. The semiconductor device of claim 1, wherein the first timing alignment and the second timing alignment allow the mask pattern being time-aligned with the parallel data.

3. The semiconductor device of claim 1, further comprising:
   a clock generator coupled to the first deserializer and the second deserializer, the clock generator being configured to generate the set of write clock signals based on a data strobe signal.

4. The semiconductor device of claim 3, wherein the clock generator is configured to output the set of write clock signals with a timing pattern based on three least significant bits of an address signal, the timing pattern being used to control a loading time of the parallel data.

5. The semiconductor device of claim 4, wherein the clock generator includes:
   a clock divider configured to generate a plurality of divided clock signals with frequencies divided from the data strobe signal; and
   timing control circuitry coupled to the clock divider, the timing control circuitry configured to output, based on the divided clock signals, the set of write clock signals with the timing pattern.

6. The semiconductor device of claim 1, wherein the set of write clock signals based on which the first deserializer is configured to generate the parallel data is a same as the set of write clock signals based on which the second deserializer is configured to generate the mask pattern.

7. The semiconductor device of claim 1, wherein the second deserializer is configured to have a matching timing characteristic to the first deserializer.

8. The semiconductor device of claim 7, wherein the second deserializer is configured to have matching transistor delays to the first deserializer.

9. The semiconductor device of claim 7, wherein the second deserializer is configured to have matching wire delays to the first deserializer.

10. A method for masking data, comprising:
forming a first deserializer and a second deserializer of a same circuit structure;
converting serial data using the first deserializer to output parallel data based on a set of write clock signals, the parallel data having a first timing alignment with regard to the set of write clock signals;
outputting a mask pattern using the second deserializer based on the set of write clock signals, the mask pattern having a second timing alignment with regard to the set of write clock signals; and
combining the parallel data with the mask pattern to generate valid data,
wherein the first deserializer outputs the parallel data and the second deserializer outputs the mask pattern at a same time, and
wherein the same circuit structure includes:
   a sampling stage configured to sample a data input carrying the serial data based on a data strobe signal;
   a first shift stage including a cascaded shift register path configured to shift the sampled serial data based on a first write clock signal and generate intermediate parallel data;
   a second shift stage including parallel cascaded shift register paths to shift the intermediate parallel data based on a second write clock signal and generate the parallel data; and
   an output stage configured to output the parallel data based on a third write clock signal.

11. The method of claim 10, further comprising:
time-aligning the mask pattern with the parallel data based on the first timing alignment and the second timing alignment.

12. The method of claim 10, further comprising:
generating the set of write clock signals based on a data strobe signal.

13. The method of claim 12, further comprising:
outputting the set of write clock signals with a timing pattern based on an address signal, the timing pattern being used to control a loading time of the parallel data.

14. The method of claim 13, further comprising:
frequency-dividing the data strobe signal to generate a plurality of divided clock signals; and
outputting, based on the divided clock signals, the set of write clock signals with the timing pattern.

15. The method of claim 10, wherein the set of write clock signals based on which the first deserializer is configured to generate the parallel data is a same as the set of write clock signals based on which the second deserializer is configured to generate the mask pattern.

16. The method of claim 10, further comprising:
forming the second deserializer with matching timing characteristic to the first deserializer.

17. The method of claim 16, further comprising:
forming the second deserializer with matching transistor delays to the first deserializer.

18. The method of claim 16, further comprising:
forming the second deserializer with matching transistor delays to the first deserializer.

19. A memory device, comprising:
a memory cell array configured to write data in parallel; and
peripheral circuitry comprising:
   a first deserializer configured to convert serial data to parallel data with a first timing alignment with regard to a set of write clock signals;
   a second deserializer configured to generate a mask pattern with a second timing alignment with regard to the set of write clock signals; and
   a write data converter coupled to the first deserializer and the second deserializer, the write data converter configured to generate valid data for writing to the memory cell array by combining the parallel data with the mask pattern,
   wherein the first deserializer outputs the parallel data and the second deserializer outputs the mask pattern at a same time, and the first deserializer and the second deserializer are configured to have a same circuit structure that includes:
      a sampling stage configured to sample a data input carrying the serial data based on a data strobe signal;
      a first shift stage including a cascaded shift register path configured to shift the sampled serial data based on a first write clock signal and generate intermediate parallel data;
      a second shift stage including parallel cascaded shift register paths to shift the intermediate parallel data based on a second write clock signal and generate the parallel data; and
      an output stage configured to output the parallel data based on a third write clock signal.

20. The memory device of claim 18, wherein the memory device includes a three-dimensional NAND Flash memory device.

* * * * *